United States Patent
Tai (10) Patent No.: US 11,493,946 B2
(45) Date of Patent: *Nov. 8, 2022

(54) SIGNAL GENERATING DEVICE AND METHOD OF GENERATING TEMPERATURE-DEPENDENT SIGNAL

(71) Applicant: TAIWAN SEMICONDUCTOR MANUFACTURING COMPANY LTD., Hsinchu (TW)

(72) Inventor: Chia Liang Tai, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/356,307

(22) Filed: Jun. 23, 2021

(65) Prior Publication Data

US 2021/0318709 A1   Oct. 14, 2021

Related U.S. Application Data (63) Continuation of application No. 16/668,854, filed on Oct. 30, 2019, now Pat. No. 11,068,011.

(51) Int. Cl.
| | | |
|---|---|---|
| *G05F 3/30* | (2006.01) | |
| *H03K 3/021* | (2006.01) | |
| *H03K 3/011* | (2006.01) | |
| *G05F 3/26* | (2006.01) | |

(52) U.S. Cl.
CPC .................. *G05F 3/30* (2013.01); *G05F 3/26* (2013.01); *G05F 3/267* (2013.01); *H03K 3/011* (2013.01); *H03K 3/021* (2013.01)

(58) Field of Classification Search
None
See application file for complete search history.

(56) References Cited

U.S. PATENT DOCUMENTS

| | | | | |
|---|---|---|---|---|
| 4,924,113 A * | 5/1990 | Schade, Jr. | ............. | G05F 3/265 323/316 |
| 5,767,664 A * | 6/1998 | Price | ......................... | G05F 3/30 323/313 |
| 6,529,066 B1 * | 3/2003 | Guenot | ..................... | G05F 3/30 323/313 |
| 8,058,863 B2 * | 11/2011 | Cho | .......................... | G05F 3/30 323/316 |
| 8,120,415 B2 * | 2/2012 | Conte | ....................... | G05F 3/30 327/539 |
| 9,568,929 B2 * | 2/2017 | Eberlein | ................. | G05F 1/575 |
| 9,912,330 B2 * | 3/2018 | Kim | ......................... | G01K 7/01 |
| 2018/0210480 A1 * | 7/2018 | Sone | ........................ | G05F 3/267 |

* cited by examiner

*Primary Examiner* — Thomas J. Hiltunen (74) *Attorney, Agent, or Firm* — WPAT Law; Anthony King (57) ABSTRACT

A signal generating device includes: a first circuit arranged to generate a first current to a first bipolar junction transistor therein; a second circuit coupled to the first circuit via an output terminal for generating a second current to a second BJT therein; and a first control circuit coupled to the first circuit and the second circuit, for generating a first adjusting current and a second adjusting current to the first circuit and the second circuit for adjusting the first current and the second current such that the first circuit and the second circuit outputs a temperature-dependent signal on the output terminal.

20 Claims, 10 Drawing Sheets

SIGNAL GENERATING DEVICE AND METHOD OF GENERATING TEMPERATURE-DEPENDENT SIGNAL

CROSS-REFERENCE TO RELATED APPLICATION

This application is a continuation of U.S. application Ser. No. 16/668,854, filed on Oct. 30, 2019, which is incorporated by reference in their entirety.

BACKGROUND

In the field of integrated circuits (ICs), a thermal sensor is typically used to detect a temperature of the IC, and a bandgap reference circuit is used to provide a stable and low temperature coefficient reference voltage. Both of the thermal sensor and the bandgap reference circuit use a PTAT (Proportional to absolute temperature) circuit to generate a PTAT signal. The PTAT circuit uses the electrical characteristics of the voltage difference between two base-emitter voltages, i.e. delta VBE, to generate the PTAT signal. However, the linearity of the PTAT signal in response to the absolute temperature deteriorates in advanced semiconductor technology. Therefore, a high linearity PTAT signal is highly desirable in the field of thermal sensor or bandgap reference circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
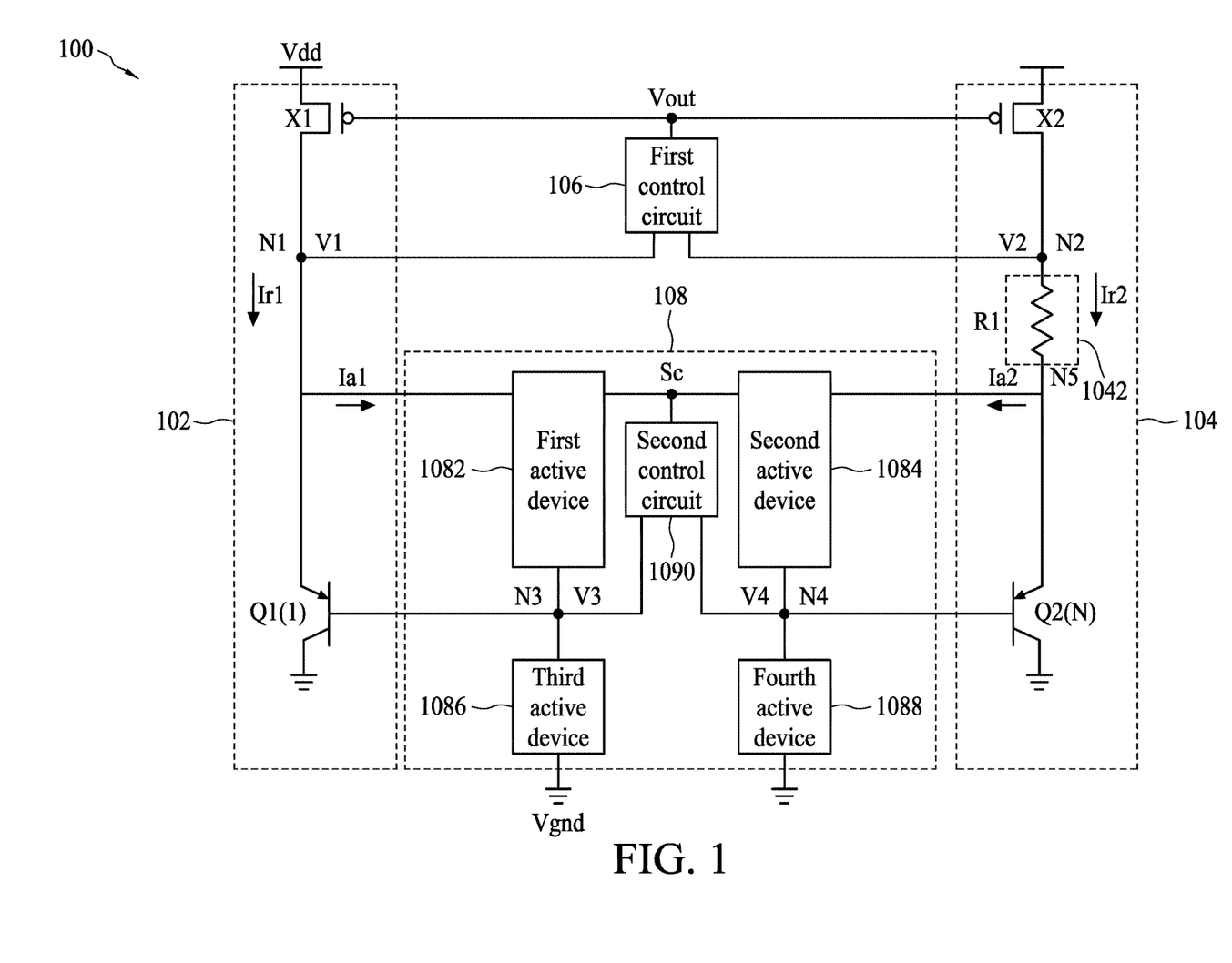
FIG. 1 is a diagram illustrating a signal generating device in accordance with some embodiments.

FIG. 1 is a diagram illustrating a signal generating device 100 in accordance with some embodiments. The signal generating device 100 is arranged to generate a temperature-dependent signal. For example, the temperature-dependent signal may be a current signal or a voltage signal that is proportional to absolute temperature (PTAT). In this embodiment, the signal generating device 100 is arranged to generate a PTAT voltage signal Vout. In another embodiment, the PTAT voltage signal Vout may be converted into a PTAT current signal by using a current mirror. The signal generating device 100 comprises a first circuit 102, a second circuit 104, a first control circuit 106, and a second control circuit 108. The first circuit 102 is coupled between a supply voltage Vdd and a ground voltage Vgnd for generating a first current Ir1 to a first terminal N1. The second circuit 104 is coupled to the first circuit 102, and is coupled between the supply voltage Vdd and the ground voltage Vgnd for generating a second current Ir2 to a second terminal N2. The first control circuit 106 is coupled between the first circuit 102 and the second circuit 104 for controlling the output voltage signal Vout according to the first current Ir1 or a first voltage V1 on the first terminal N1 and the second current Ir2 or a second voltage V2 on the second terminal N2. The second control circuit 108 is coupled between the first circuit 102 and the second circuit 104 for generating a first adjusting current Ia1 and a second adjusting current Ia2 to the first circuit 102 and the second circuit 104 according to a base signal (or base voltage) V3 on a third terminal N3 of the first circuit 102 and a base signal V4 on a fourth terminal N4 of the second circuit 104 respectively.

According to some embodiments, the first circuit 102 comprises a first p-type field-effect transistor (p-type FET) X1 and a first p-type bipolar junction transistor (p-type BJT or PNP) Q1. The second circuit 104 comprises a second p-type FET X2, a second p-type BJT Q2, and a resistor 1042. The sources of the p-type FETs X1 and X2 are coupled to the supply voltage Vdd. The drain (i.e. N1) of p-type FET X1 is coupled to the emitter of the p-type BJT Q1. The drain (i.e, N2) of p-type FET X2 is coupled to a first terminal (i.e. N2) of the resistor 1042, and a second terminal (i.e. N5) of the resistor 1042 is coupled to the emitter of the p-type BJT Q2. The gate of the p-type FET X1 is coupled to the gate of the p-type FET X2 to output the voltage signal Vout. The collectors of the p-type BJTs Q1 and Q2 are coupled to the ground voltage Vgnd.

The first control circuit 106 may be a differential amplifier to generate the voltage signal Vout by comparing the first voltage V1 and the second voltage V2. The differential amplifier may be implemented by an operational transconductance amplifier (OTA) that generates an output current according to differential input voltages. Moreover, the first control circuit 106 in combination with the p-type FETs X1 and X2 are configured to be a negative feedback loop to equalize the first voltage V1 and the second voltage V2.

The second control circuit 108 comprises a first active device 1082, a second active device 1084, a third active device 1086, a fourth active device 1088, and a differential amplifier 1090. The differential amplifier 1090 is arranged to compare the base signal V3 and the base signal V4 to generate a control signal Sc. The control signal Sc may be differential output signals, in which the positive signal of the differential output signals is coupled to the first active device 1082, and the negative signal of the differential output signals is coupled to the second active device 1084. The differential amplifier 1090 may be implemented by an operational transconductance amplifier (OTA) that generates an output current according to differential input voltages. The active device 1082 is coupled between the terminals N1 and N3 for generating the first adjusting current Ia1 according to the control signal Sc. The active device 1084 is coupled between the terminals N5 and N4 for generating the second adjusting current Ia2 according to the control signal Sc. The active device 1086 is coupled between the terminal N3 and the ground voltage Vgnd. The active device 1088 is coupled between the terminal N4 and the ground voltage Vgnd. According to some embodiments, the differential amplifier 1090 in combination with the active devices 1082, 1084, and the p-type BJTs Q1 and Q2 are configured to be a negative feedback loop to equalize the base signal V3 and the base signal V4. The differential amplifier 1090 may be implemented by a differential amplifier that generates an output current according to the differential input voltages.

Figure 2:
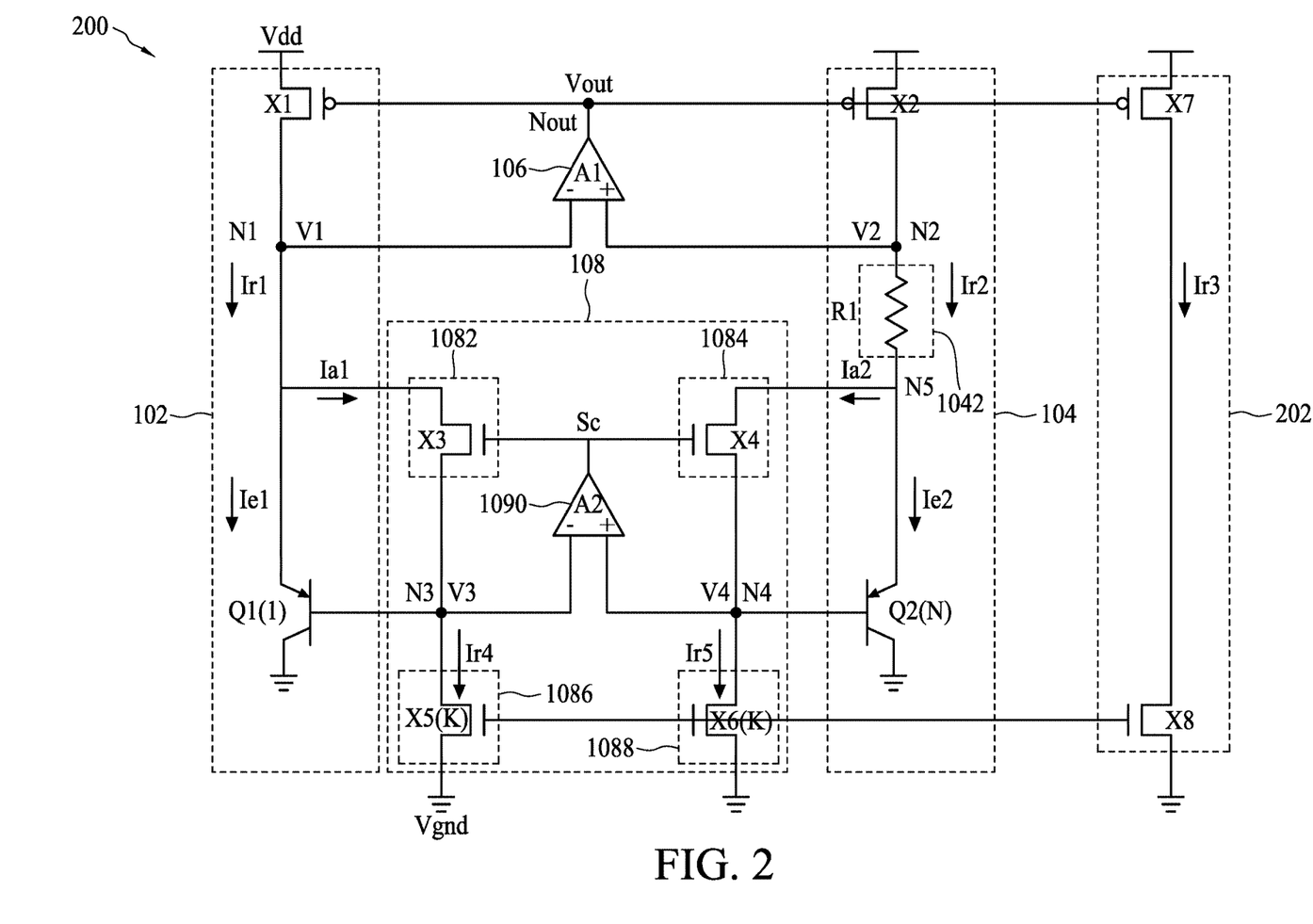
FIG. 2 is a schematic diagram illustrating a signal generating device in accordance with some embodiments.

FIG. 2 is a schematic diagram illustrating a signal generating device 200 in accordance with some embodiments. The signal generating device 200 may be a circuit implementation of the signal generating device 100. For brevity, a portion of signal and device labels in the signal generating device 200 is similar to the comparing device 100. According to some embodiments, the first control circuit 106 is implemented by a differential amplifier with a gain A1, in which the inverting input terminal (−) is coupled to the terminal N1, the non-inverting input terminal (+) is coupled to the terminal N2, and the output terminal is coupled to the gates of the p-type FETs X1 and X2. In the second control circuit 108, the active devices 1082, 1084, 1086, 1088, and the differential amplifier 1090 are implemented by a first n-type FETs X3, X4, X5, X6, and a differential amplifier with a gain A2 respectively. The gain A2 may different from the gain A1. The inverting input terminal (−) of the differential amplifier (i.e. 1090) is coupled to the terminal N3, the non-inverting input terminal (+) of the differential amplifier (i.e. 1090) is coupled to the terminal N4, and the output terminal of the differential amplifier (i.e. 1090) is coupled to the gates of the n-type FETs X3 and X4. The drains of the n-type FETs X3 and X4 are coupled to the terminals N1 and N5 respectively. The sources of the n-type FETs X3 and X4 are coupled to the bases of the p-type BJTs Q1 and Q2 respectively. The drains of the n-type FETs X5 and X6 are coupled to the bases of the p-type BJTs Q1 and Q2 respectively. The sources of the re-type FETs X5 and X6 are coupled to the ground voltage Vgnd. The gate the n-type FET X5 is coupled to the gate the n-type FET X6.

According to some embodiments, the signal generating device 200 further comprises a third circuit 202. The third circuit 202 comprises a p-type FET X7 and an n-type FET X8. The gate of the p-type FET X7 is coupled to the gate of the p-type FETs X1 and X2, the source of the p-type FET X7 is coupled to the supply voltage Vdd, and the drain of the p-type FET X7 is coupled to the drain of the n-type FET X8. The gate of the n-type FET X8 is coupled to the gates of the n-type FETs X5 and X6, and the source of the n-type FET X8 is coupled to the ground voltage Vgnd. The third circuit 202 is arranged to generate a third reference current Ir3 for the n-type FETs X5 and X6, The n-type FETs X5 and X6 are arranged to mirror the current Ir3 to generate the currents Ir4 and Ir5 respectively.

According to some embodiments, the sizes (or aspect ratio, W/L) of the p-type FETs X1, X2, and X7 are substantially equal with each other. The sizes of the re-type FETs X5 and X6 are K times larger than the size of the n-type FET X8. The size (or emitter size) of the p-type BJT Q2 is N times greater than the size of the p-type BJT Q1. Therefore, the currents Ir1, Ir2, and Ir3 are substantially equal with each other, i.e. Ir1=Ir2=Ir3=IE. The drain currents Ir4 and Ir5 of the n-type FETs X5 and X6 are K times greater than the third current Ir3. In other words, the current Ir4 or Ir5 is K times greater than the current Ir1 or Ir2, i.e. Ir4=Ir5=K*IE. The currents Ir4 and Ir5 are the mirror currents of the current Ir3.

Figure 3:
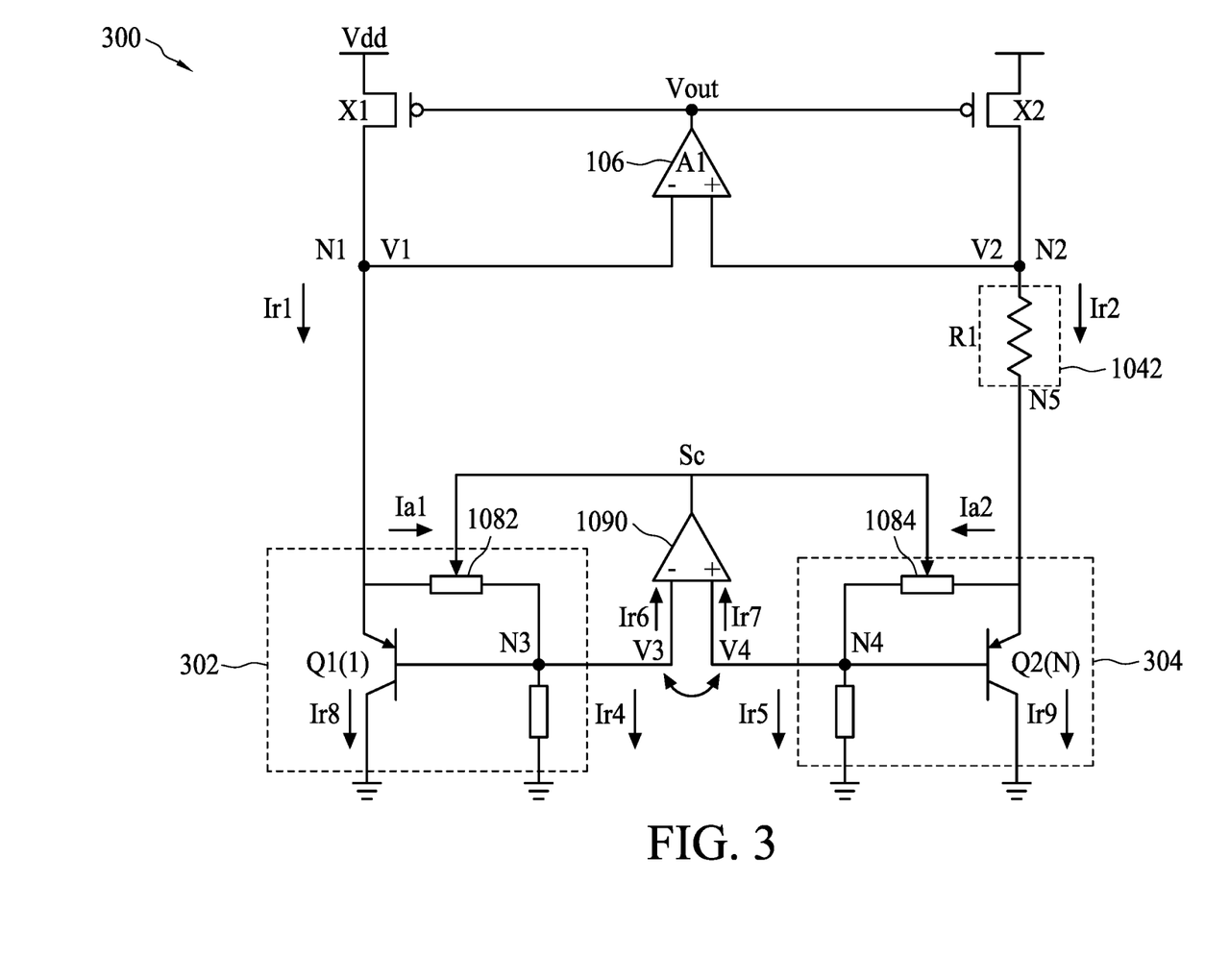
FIG. 3 is a diagram illustrating a simplified signal generating device in accordance with some embodiments.

FIG. 3 is a diagram illustrating a simplified signal generating device 300 in accordance with some embodiments. The signal generating device 300 may be the simplified diagram of the signal generating device 200. By using the differential amplifier 1090, the bases (i.e. N3 and N4) of the p-type BJTs Q1 and Q2 are virtually connected such that the base signal V3 and the base signal V4 of are equal. Moreover, the base signal V3 and the base signal V4 are not 0V or grounded. The currents Ir6 and Ir7 flowing into the inverting terminal (−) and the non-inverting terminal (+) of the differential amplifier 1090 are substantially zero or 0 A. The following equation (1) expresses the current Ir8:

$$Ir8 = Ir1 - Ir4 = IE - K*IE = (1-K)*IE = \alpha1*IE \qquad (1)$$

The parameter α1 is a fixed value decided by the ratio (i.e. K) of the size of the n-type FET X5 to the size of the n-type FET X8.

Similarly, the following equation (2) expresses the current Ir9:

$$Ir9 = Ir2 - Ir5 = IE - K*IE = (1-K)*IE = \alpha2*IE \qquad (2)$$

The parameter α2 (i.e. 1−K) is a fixed value decided by the ratio (i.e. K) of the size of the n-type FET X6 to the size of the n-type FET X8. In this embodiment, the parameter α2 is equal to the parameter α1, i.e. α1=α2

According to some embodiments, the current Ir2 is PTAT current, and the current Ir2 may be expressed by the following equation (3):

$$Ir2 = \Delta VBE/R1 \qquad (3)$$

The parameter R1 is the resistance of the resistor 1042. The parameter ΔVBE is the voltage difference between the base-emitter voltage VBE1 of the p-type BJT Q1 and the base-emitter voltage VBE2 of the p-type BJT Q2. The value of ΔVBE may be expressed by the following equation (4):

$$\Delta VBE = VT * \ln((Ir8/Ir9)*(Is2/Is1)) = \qquad (4)$$
$$VT * \ln((Ir1/Ir2)*(\alpha 1/\alpha 2)*N) = VT * \ln(N)$$

The parameters Is1 and Is2 are the saturation currents of the p-type BJTs Q1 and Q2 respectively. The parameter VT is the thermal voltage of the p-type BJT Q1 and/or Q2. The parameter N is ratio of the size of the p-type BJT Q2 to the size of the p-type BJT Q1.

Accordingly, the PTAT current Ir2 may be expressed by the following equation (5):

$$Ir2=(VT/R1)*\ln(N) \qquad (5)$$

According to some embodiments, the parameters R1 and N may have constant values, or the values of R1 and N may not be changed with the absolute temperature. The thermal voltage VT of the p-type BJTs Q1 and Q2 may proportional to the absolute temperature. Therefore, as expressed in the above equation (5), the value of current Ir2 is proportional to the absolute temperature. In other words, by using the second control circuit 108, the current Ir2 is a PTAT current, and the current Ir2 is not depended on the current gains (i.e. alpha, α) of the p-type BJTs Q1 and Q2. When the temperature coefficient of the current Ir2 is depended on the terminal voltage VT of the p-type BJTs Q1 and Q2, and is not depended on the current gains of the p-type BJTs Q1 and Q2, the linearity of the current Ir2 in response to the temperature may be improved.

Moreover, the first adjusting current Ia1 and the second adjusting current Ia2 are generated to adjust the emitter current Ie1 of the p-type BJT Q1 and the emitter current Ie2 of the p-type BJT Q2 according to the base signal (i.e. V3) of the p-type BJT Q1 and the base signal (i.e. V4) of the p-type BJT Q2. The adjusted emitter currents Ie1, Ie2 of the p-type BJTs Q1 and Q2 may accordingly adjust the base signals (i.e. V3 and V4) of the p-type BJTs Q1 and Q2 respectively. Therefore, the collector currents (i.e. Ir8 and Ir9) of the p-type BJTs Q1 and Q2 may remain constant current. By using the second control circuit 108, the BJT circuit 302, which includes the p-type BJT Q1, as well as BJT circuit 304 in FIG. 3 may operate like a FET, in which the current Ir1 may be regarded as drain current of the FET, the total current of Ir8 and Ir4 may be regarded as source current of the FET, and the terminal N3 may be regarded as the gate of the FET. When the BJT circuit 302 in FIG. 3 operates like a FET, the current gain (i.e. alpha, α) of the p-type BJT Q1 in the BJT circuit 302 may be regarded as an internal parameter of the BJT circuit 302. Accordingly, the current gain (i.e. alpha, α) of the p-type BJT Q1 in the BJT circuit 302 and the current gain (i.e. alpha, α) of the p-type BJT Q2 in the BJT circuit 304 may not affect the currents Ir1 and Ir2 respectively. Therefore, the linearity of the currents Ir1 and Ir2 in response to the temperature may be improved.

Figure 4:
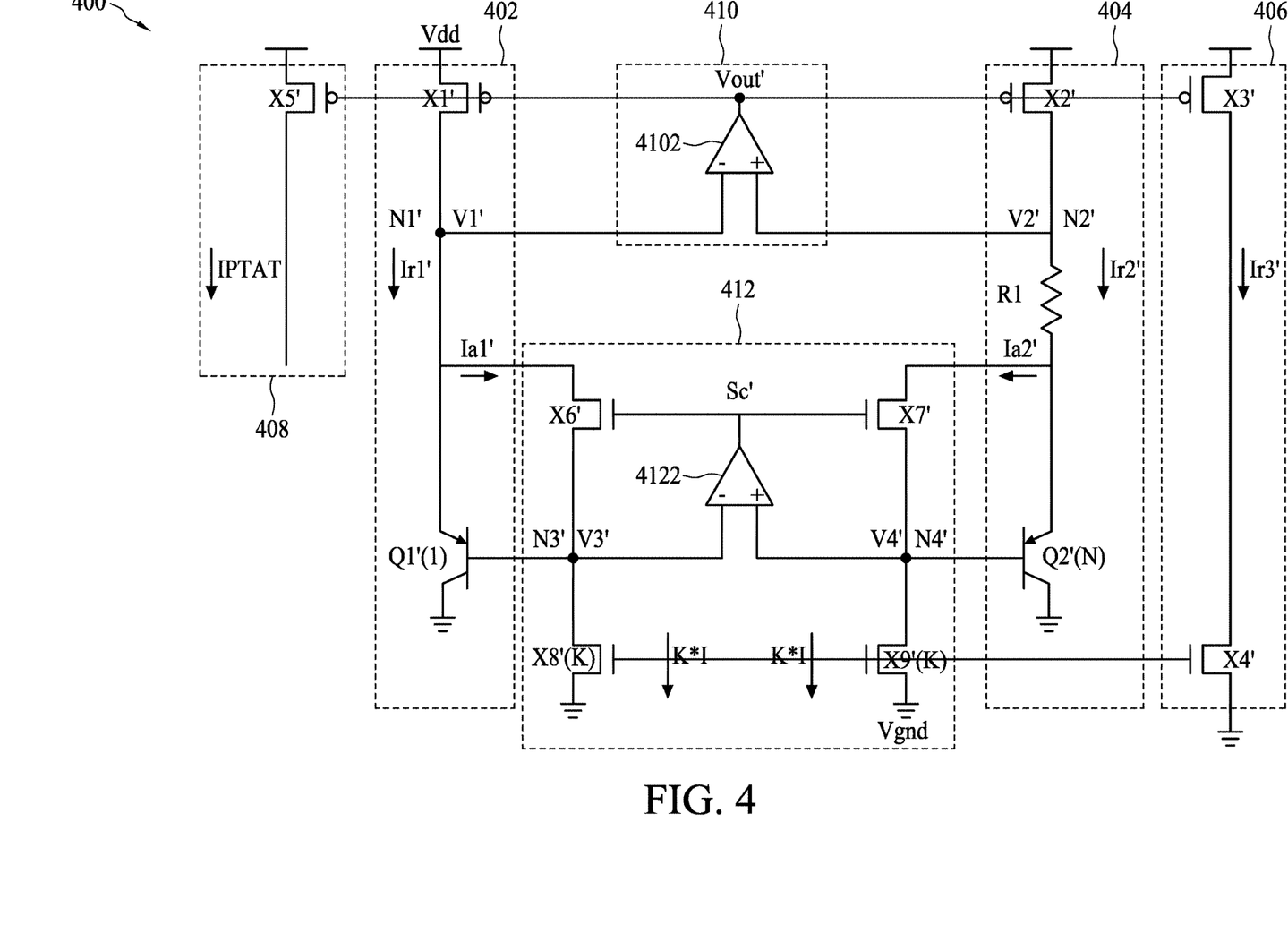
FIG. 4 is a diagram illustrating a signal generating device in accordance with some embodiments.

FIG. 4 is a diagram illustrating a signal generating device 400 in accordance with some embodiments. The signal generating device 400 is arranged to generate a PTAT current IPTAT. Therefore, the signal generating device 400 may be applied to form a temperature sensor. The signal generating device 400 comprises a first circuit 402, a second circuit 404, a third circuit 406, a fourth circuit 408, a first control circuit 410, and a second control circuit 412. The first circuit 402, the second circuit 404, and the third circuit 406 are couple between the supply voltage Vdd and the ground voltage Vgnd for generating the currents Ir1', Ir2', and Ir3' respectively. The first control circuit 410 is coupled between the first circuit 402 and the second circuit 404 for generating an output voltage signal Vout' according to a first voltage V1' on the first terminal N1' and a second voltage V2' on the second terminal N2'. The second control circuit 412 is coupled between the first circuit 402 and the second circuit 404 for generating a first adjusting current Ia1' and a second adjusting current Ia2' to the first circuit 402 and the second circuit 404 according to a base signal V3' on a third terminal N3' of the first branch 402 and a base signal V4' on a fourth terminal N4' of the second branch 404 respectively. The fourth circuit 408 is coupled to the first circuit 402 and the second circuit 404 for generating the PTAT current IPTAT according to the output voltage signal Vout'.

According to some embodiments, the first circuit 402 comprises a p-type FET X1' and a p-type BJT Q1'. The second circuit 404 comprises a p-type FET X2', a p-type BJT Q2', and a resistor 4042. The third circuit 406 comprises a p-type FET X3' and an n-type FET X4'. The fourth circuit 408 comprises a p-type FET X5'. The first control circuit 410 comprises a differential amplifier 4102. The second control circuit 412 comprises a first n-type FET X6', a second n-type FET X7', a third n-type FET X8', a fourth n-type FET X9', and a differential amplifier 4122.

In this embodiment, the first circuit 402, the second circuit 404, the third circuit 406, the first control circuit 410, and the second control circuit 412 are similar to the first circuit 102, the second circuit 104, the third circuit 202, the first control circuit 106, and the second control circuit 108 respectively. Therefore, the detailed description of the first circuit 402, the second circuit 404, the third circuit 406, the first control circuit 410, and the second control circuit 412 is omitted here for brevity.

For the fourth circuit 408, the gate of the p-type FET X5' is coupled to the gates of the p-type FET X1' and X2', the source of the p-type FET X5' is coupled to the supply voltage Vdd, and the drain of the p-type FET X5' is arranged to output the PTAT current IPTAT. More specifically, the PTAT current IPTAT is mirrored from the Ir2', thus the PTAT current IPTAT has relatively good linearity in response to the absolute temperature. The detailed description is omitted here for brevity.

Figure 5:
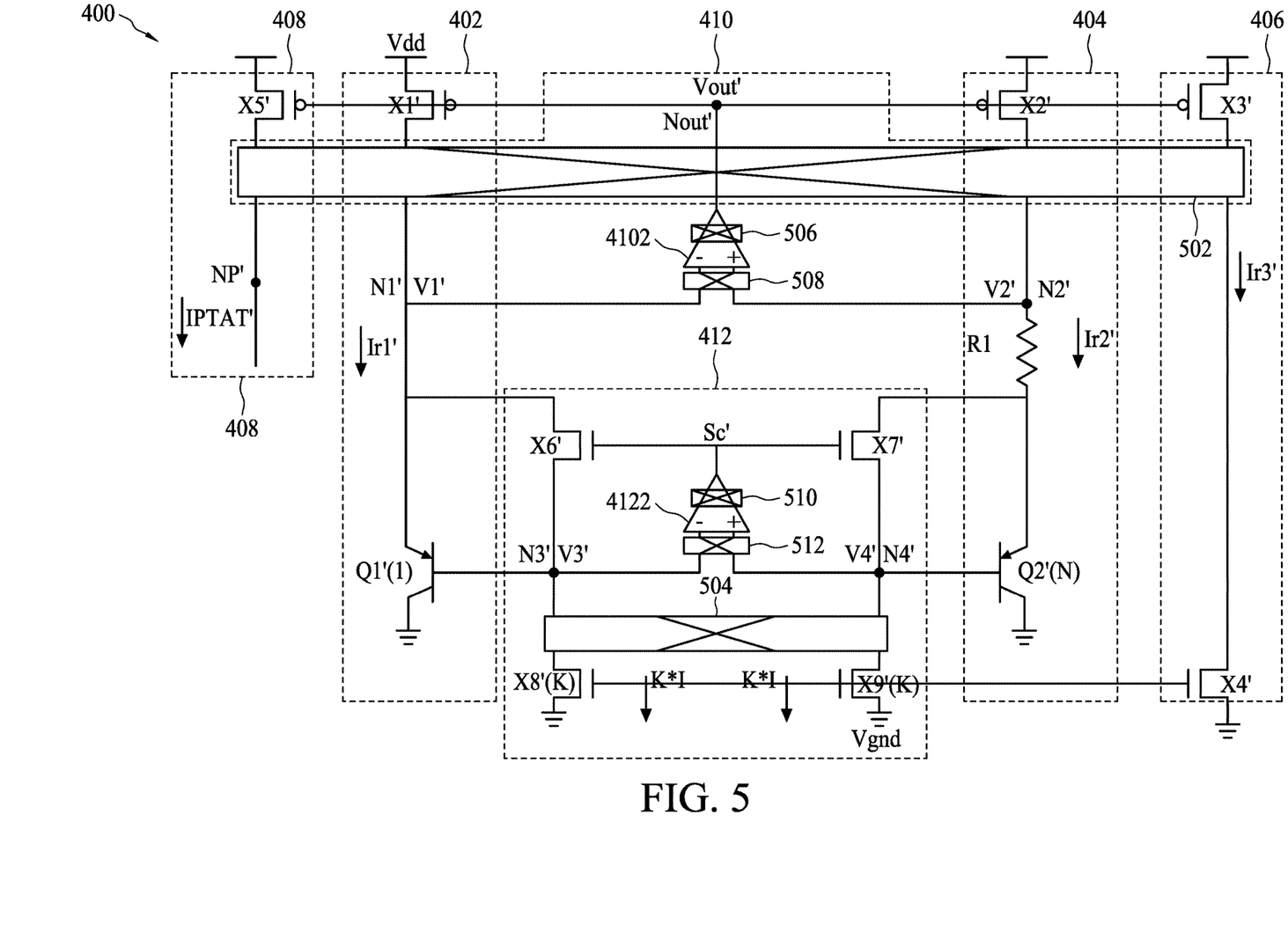
FIG. 5 is a diagram illustrating a signal generating device in accordance with some embodiments.

FIG. 5 is a diagram illustrating a signal generating device 500 in accordance with some embodiments. The signal generating device 500 is arranged to generate a PTAT current IPTAT'. For brevity, the numerals in the signal generating device 500 is similar to the numerals in the signal generating device 400. In comparison to the signal generating device 400, the signal generating device 500 further comprises a first dynamic element matching (DEM) device 502, a second DEM device 504, a first chopper 506, a second chopper 508, a third chopper 510, and a fourth chopper 512. According to some embodiments, the DEM device 502 and the choppers 506 and 508 are formed in the first control device 410. The DEM device 504 and the choppers 510 and 512 are formed in the second control device 412.

According to some embodiments, a chopper may be refer to numerous types of electronic switching devices and circuits used in power control and signal applications. A chopper may be a device that converts fixed DC input to a variable DC output voltage directly. A chopper may be an electronic switch that is used to interrupt one signal under the control of another. In addition, A DEM device may be a circuit applied for compensating the components mismatch of the devices connecting the two sides of the DEM device.

More specifically, the first side of the DEM device 502 is coupled to the drains of the p-type FETs X1', X2', X3', and X5', and the gates of the p-type FETs X1' and X2'. The second side of the DEM device 502 is coupled to the terminals N1', N2', the drain of the n-type FET X4', the output of the differential amplifier 4102, and the terminal Np' for outputting the PTAT current IPTAT'. The chopper 506 is coupled to the output terminal of the differential amplifier 4102 for chopping the output voltage signal Vout'. The first side of the chopper 508 is coupled to the inverting terminal (−) and the non-inverting terminal of the differential amplifier 4102. The second side of the chopper 510 is coupled to the terminals N1' and N2'. The chopper 508 is arranged for chopping the voltages V1' and V2'.

The first side of the DEM 504 is coupled to the terminals N3' and N4'. The second side of the DEM 504 is coupled to the drains of the n-type FETs X8' and X9'. The chopper 510 is coupled to the output terminal of the differential amplifier 4102 for chopping the control signal Sc'. The first side of the chopper 512 is coupled to the inverting terminal (−) and the non-inverting terminal of the differential amplifier 4122. The second side of the chopper 512 is coupled to the terminals N3' and N4'. The chopper 512 is arranged for chopping the base signals V3' and V4'.

Figure 6:
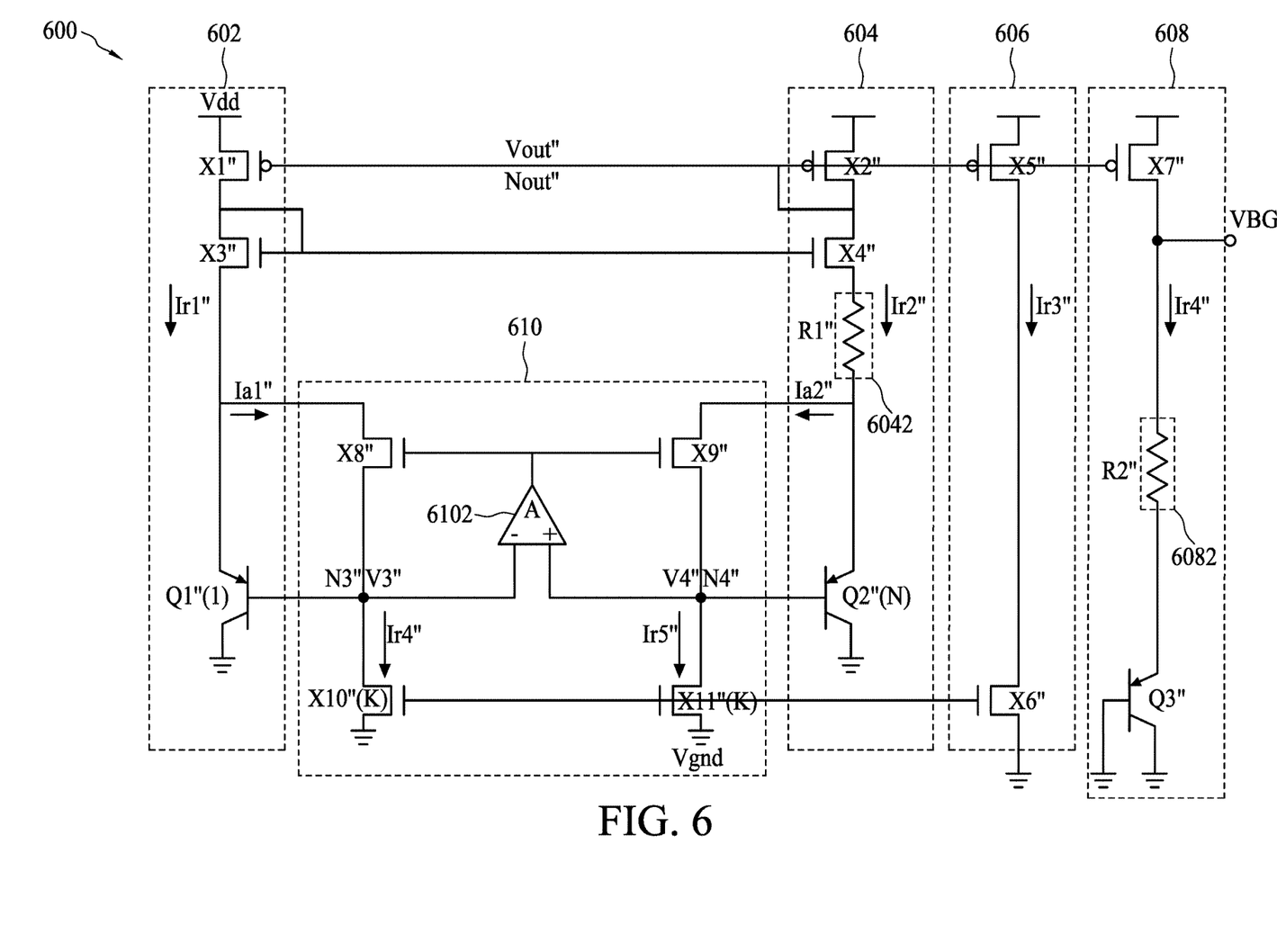
FIG. 6 is a diagram illustrating a signal generating device in accordance with some embodiments.

FIG. 6 is a diagram illustrating a signal generating device 600 in accordance with some embodiments. The signal generating device 600 may be a bandgap reference device for generating a reference voltage signal VBG. The signal generating device 600 comprises a first circuit 602, a second circuit 604, a first control circuit 606, and a second control circuit 608. The first circuit 602, the second circuit 604, and the third circuit 606 are couple between the supply voltage Vdd and the ground voltage Vgnd for generating the currents Ir1", Ir2", and Ir3" respectively. The control circuit 610 is coupled between the first circuit 602 and the second circuit 604 for generating a first adjusting current Ia1" and a second adjusting current Ia2" to the first circuit 602 and the second circuit 604 according to a base signal V3" on a third terminal N3" of the first branch 602 and a base signal V4" on a fourth terminal N4" of the second branch 604 respectively. The fourth circuit 608 is coupled to the first circuit 602 and the second circuit 604 for generating the reference voltage signal VBG according to the output voltage signal Vout".

According to some embodiments, the first circuit 602 comprises a p-type FET X1", an n-type FET X3", and a p-type BJT Q1". The second circuit 604 comprises a p-type FET X2", an n-type FET X4", a p-type BJT Q2", and a resistor 6042. The third circuit 606 comprises a p-type FET X5" and an n-type FET X6". The fourth circuit 608 comprises a p-type FET X7", a p-type BJT Q3", and a resistor 6082. The control circuit 610 comprises a first n-type FET X8", a second n-type FET X9", a third n-type FET X10", a fourth n-type FET X11", and a differential amplifier 6102.

In this embodiment, the control circuit 610 and the third circuit 606 are similar to the second control circuit 108 and the third circuit 202 respectively. Therefore, the detailed description of the control circuit 410 and the third circuit 606 is omitted here for brevity.

For the first circuit 602 and the second circuit 604, the sources of the p-type FETs X1" and X2" are coupled to the supply voltage Vdd. The gate of the p-type FETs X1" is coupled to the gate of the p-type FETs X2". Moreover, the p-type FETs X2" is a diode-connected FET, i.e. the drain of the p-type FETs X2" is connected to the gate of the p-type FETs X2". The drain of the n-type FETs X3" is coupled to the drain of the p-type FETs X1", the drain of the n-type FETs X4" is coupled to the drain of the p-type FETs X2", and the n-type FETs X3" is a diode-connected FET, i.e. the drain of the n-type FETs X3" is connected to the gate of the n-type FETs X3". The gate of the n-type FETs X3" is coupled to the gate of the n-type FETs X4".

Moreover, the emitter of the p-type BJT Q1" is coupled to the source of the n-type FETs X3", the collector of the p-type BJT Q1" is coupled to the ground voltage Vgnd, and the base of the p-type BJT Q1" is coupled to the terminal N3" of the control circuit 610. The source of the n-type FETs X4" is coupled to the first terminal of the resistor 6042. The emitter of the p-type BJT Q2" is coupled to the second terminal of the resistor 6042. The collector of the p-type BJT Q2" is coupled to the ground voltage Vgnd, and the base of the p-type BJT Q2" is coupled to the terminal N4" of the control circuit 610.

For the fourth circuit 608, the gate of the p-type FET X7" is coupled to the gates of the p-type FET X1" and X2", the source of the p-type FET X7" is coupled to the supply voltage Vdd, and the drain of the p-type FET X7" is coupled to the first terminal of the resistor 6082. The emitter of the p-type BJT Q3" is coupled to the second terminal of the resistor 6082, and the base and the collector of the p-type BJT Q3" is coupled to the ground voltage Vgnd.

According to the above mentioned embodiment of FIG. 4, the current Ir4" is a PTAT current, and the value of the current Ir4" may be expressed by the equation (5), i.e. Ir4"=(VT/R1")*ln(N). Therefore, the reference voltage signal VBG may be expressed by the following equation (6):

$$VBG = VEB + (VT)*(R2''/R1'')*\ln(N) \qquad (6)$$

The parameter "VEB" is the voltage drop from the emitter of the p-type BJT Q3" to the base (i.e. the ground) of the p-type BJT Q3". Moreover, the value of the term "VEB" is complementary to absolute temperature (CTAT), and the value of the term "(VT)*(R2"/R1")*ln(N)" is proportional to absolute temperature (PTAT). As mentioned above, by using the control circuit 610, the linearity of the term "(VT)*(R2"/R1")*ln(N)" in response to the absolute temperature is improved. Accordingly, the linearity of the reference voltage VBG in response to the absolute temperature is also improved.

Figure 7A:
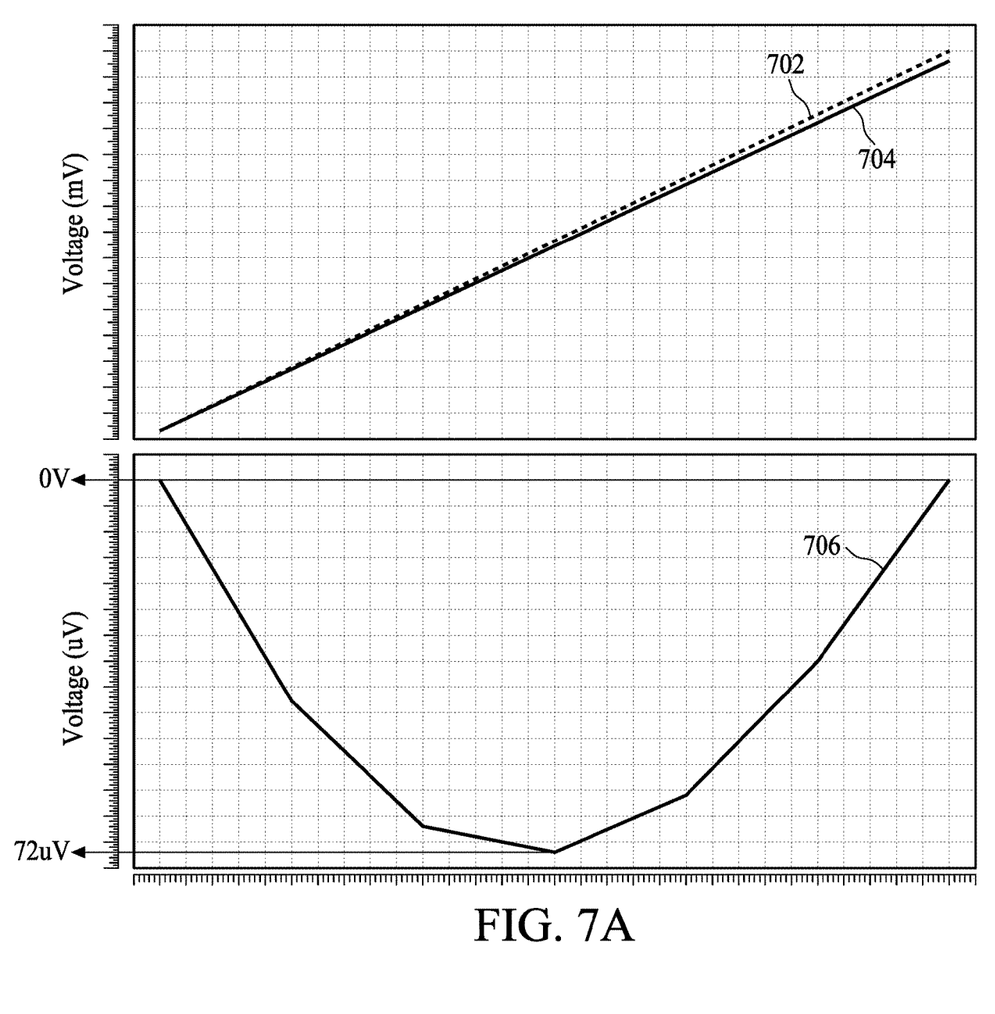
FIG. 7A is a diagram illustrating a temperature-dependent signal in response to the absolute temperature in accordance the some embodiments.
Figure 7B:
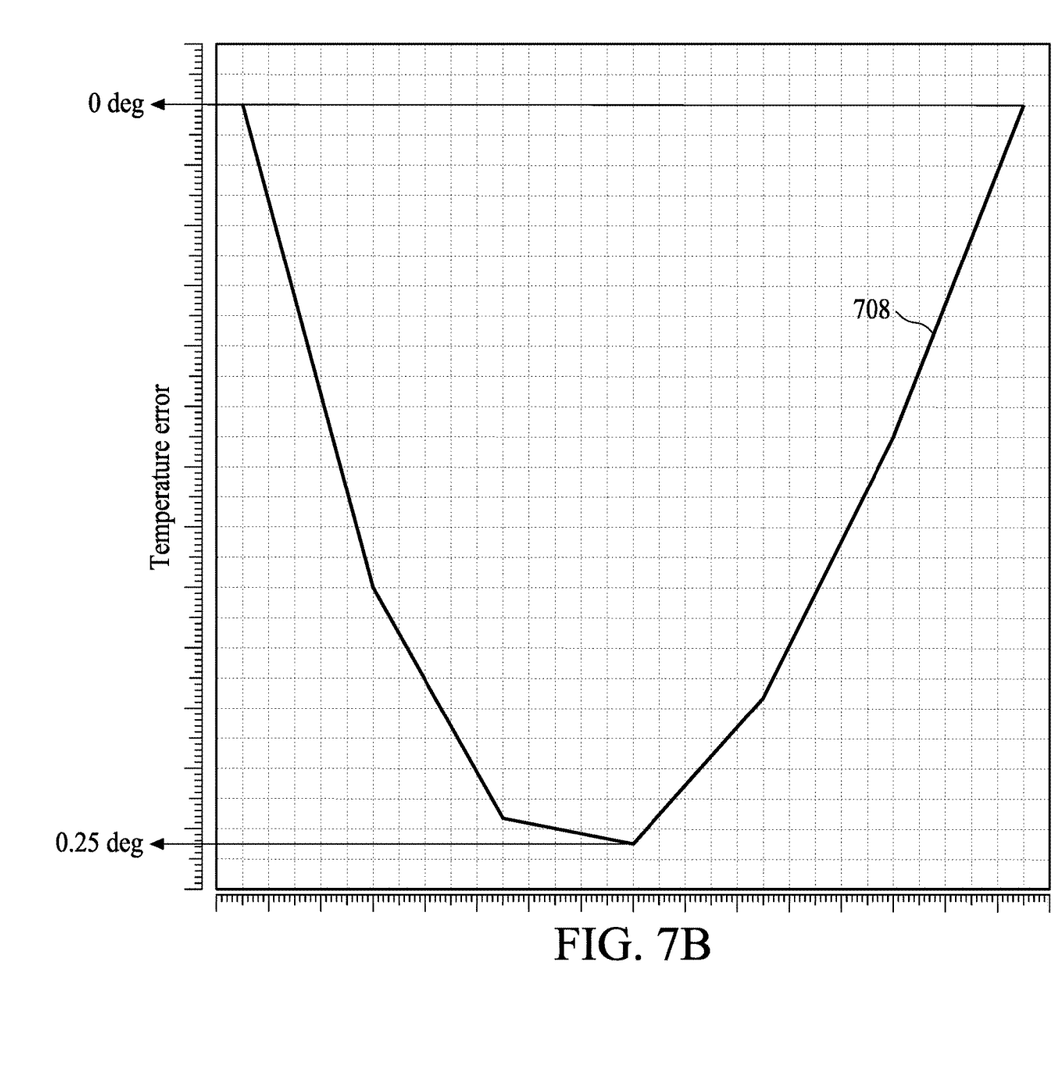
FIG. 7B is a diagram illustrating the variation of temperature error of a temperature sensor in accordance the some embodiments.

FIG. 7A is a diagram illustrating the variation of ΔVBE in response to the absolute temperature in accordance the some embodiments. The value of ΔVBE may be derived from the above mentioned equation (4). In FIG. 7A, the x-axis represents the absolute temperature T, and the y-axis represents the voltage V. The curve 702 is the variation of the ΔVBE in response to the absolute temperature Temp. The curve 704 is a straight line representing the variation of an ideal ΔVBE in response to the absolute temperature. It can be seen that the curve 702 is almost a straight line overlapped with the curve 704. Accordingly, the curvature of the curve 702 is relatively small in comparison to the curvature of the ΔVBE without applying the second control circuit 108. The curve 706 is the curvature of the curve 702 in response to the absolute temperature. In this embodiment, the maximum curvature is about 72 uV, which is much smaller than the curvature of the ΔVBE without applying the second control circuit 108. FIG. 7B is a diagram illustrating the variation of temperature error of a temperature sensor applying the present signal generating device (e.g. 400, or 500) in accordance the some embodiments. In FIG. 7B, the x-axis represents the absolute temperature Temp, and the y-axis represents the temperature error in degree. The curve 708 is the temperature error in response to the absolute temperature. It can be seen that the maximum temperature error of the curve 706 is about 0.25 degree, which is much smaller than the temperature error of the counterpart temperature sensor without applying the second control circuit 108. Accordingly, by using the second control circuit 108, the linearity of the PTAT current in response to the absolute temperature is improved.

Figure 8:
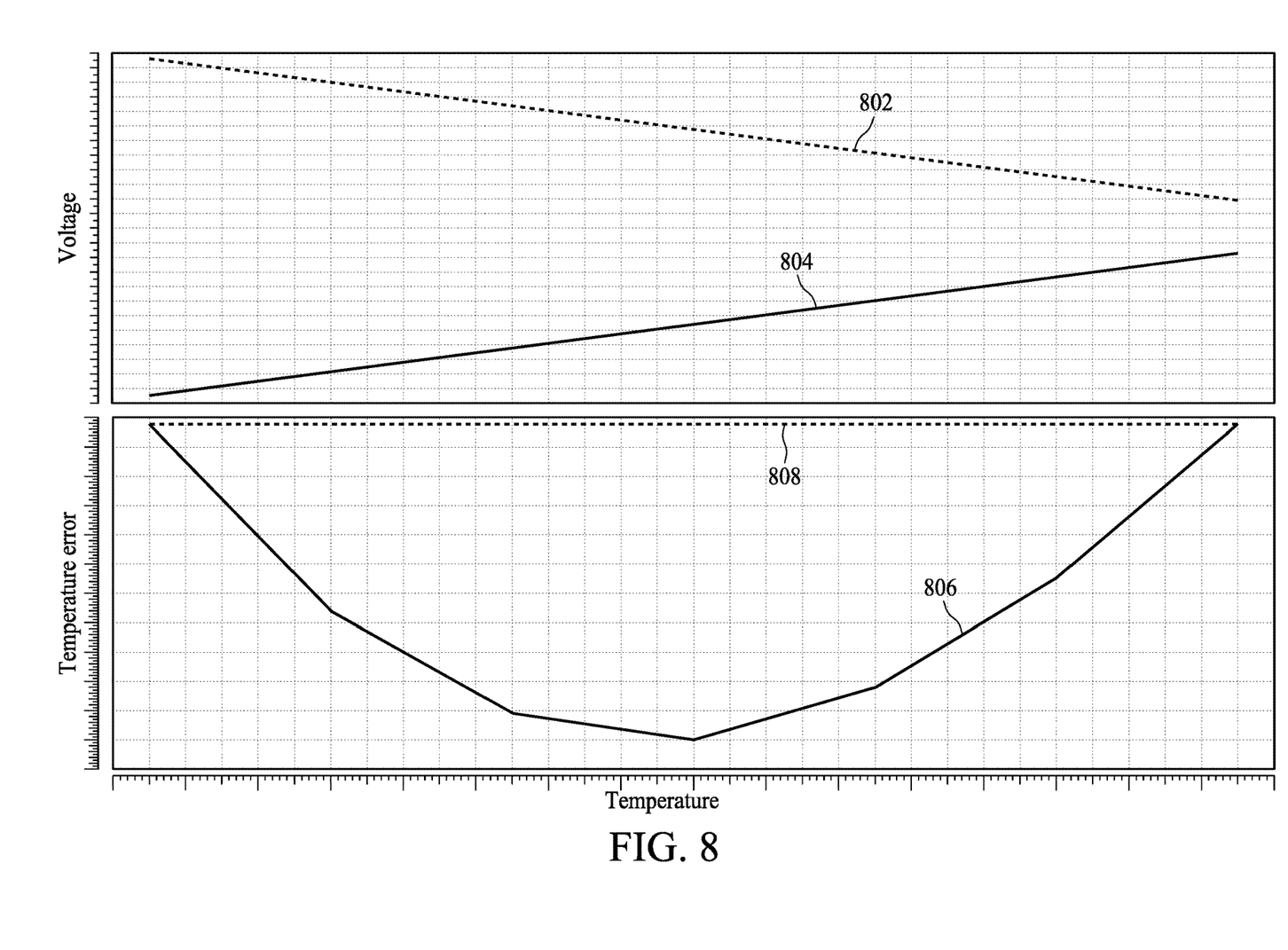
FIG. 8 is a diagram illustrating the variation of a bandgap-reference voltage and temperature error in accordance the some embodiments.

FIG. 8 is a diagram illustrating the variation of the terms in the equation (6) and temperature error in response to the absolute temperature in accordance the some embodiments. The curve 802 represents the variation of the value of the term "VEB" in the equation (6) in response to the absolute temperature. The curve 804 represents the variation of the value of the term "(VT)*(R2"/R1")*ln(N)" in the equation (6) in response to the absolute temperature. The curve 806 represents the temperature coefficient (TC) or the variation of the reference voltage VBG of the equation (6) in response to the absolute temperature. The curve 808 represents the variation of an ideal reference voltage of a bandgap circuit in response to the absolute temperature. As shown in FIG. 8, the value of the term "VEB" is complementary to absolute temperature, and the value of the term "(VT)*(R2"/R1")*ln(N)" is proportional to absolute temperature. When the value of the term "VEB" is added into the value of the term "(VT)*(R2"/R1")*ln(N)", the resulting reference voltage VBG may close to a horizontal line in response to the absolute temperature on x-axis. In this embodiment, the temperature coefficient (TC) of the resulting reference voltage VBG (i.e. the curve 806) is about −4.7 ppm/°C, which is much smaller than the TC of the counterpart without using the control circuit 610. Accordingly, by using the control circuit 610, the signal generating device 600 may generate a relatively stable reference voltage VBG in response to the absolute temperature.

Figure 9:
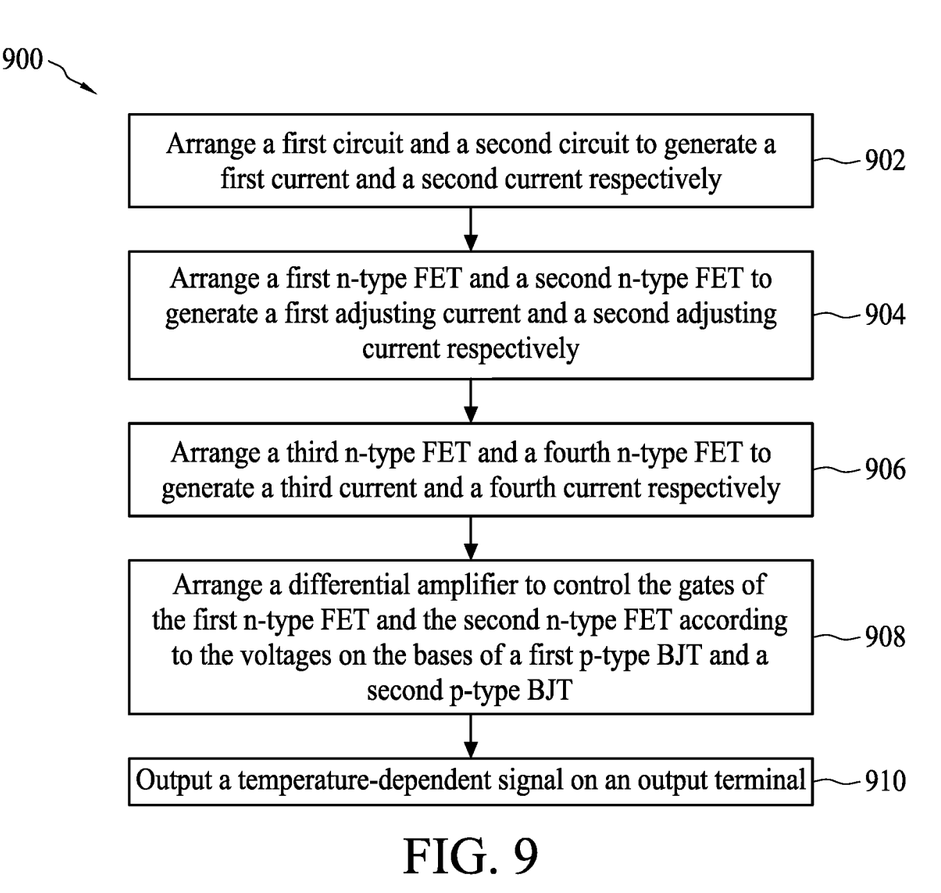
FIG. 9 is a flowchart of a method for controlling a signal generating device in accordance with some embodiments.

According to some embodiments, the operation of the signal generating device 100, 200, 300, 400, 500, or 600 may be summarized into the operations in FIG. 9. FIG. 9 is a flowchart of a method 900 for controlling a signal generating device in accordance with some embodiments. The signal generating device may be the comparing device 100, 200, 300, 400, 500, or 600. The method 900 comprises operations 902-910. In operation 902, a first circuit (e.g. 102) and a second circuit (e.g. 104) are arranged to generate a first current (e.g, Ir1) and a second current (e.g. Ir2) respectively. The first current substantially equals the second current. The first circuit comprises a first p-type BJT (e.g. Q1) for receiving the first current. The second circuit comprises a second p-type BJT (e.g. Q2) for receiving the second current.

In operation 904, a first n-type FET (e.g. X3) and a second n-type FET (e.g. X4) are arranged to generate a first adjusting current (e.g. Ia1) and a second adjusting current (e.g. Ia2) to the emitters of the first p-type BJT and the second p-type BJT respectively.

In operation 906, a third n-type FET (e.g. X5) and a fourth n-type FET (e.g. X6) are arranged to generate a third current (e.g. Ir4) and a fourth current (e.g. Ir5) on the bases of the first p-type BJT and the second p-type BJT respectively.

In operation 908, a differential amplifier (e.g. 1090) is arranged to control the gates of the first n-type FET (e.g, X3) and the second n-type FET (e.g. X4) according to the voltages on the bases of the first p-type BJT and the second p-type BJT such that the voltage on the base of the first p-type BJT equals the voltage on the base of the second p-type BJT.

In operation 910, a temperature-dependent signal is outputted on the output terminal (e.g. Nout) connecting the gates of the first circuit (e.g. 102) and the second circuit (e.g. 104).

According to the operations 902-910 of the method 900, the first BJT circuit (e.g. 302) and the second BJT circuit (e.g. 304) may operate like two FETs. When the first BJT circuit and the second BJT circuit operate like two FETs, the current gain of the first p-type BJT in the first BJT circuit and the current gain of the second p-type BJT in the second BJT circuit may be regarded as internal parameters of the BJT circuits. Accordingly, the current gain of the first p-type BJT in the first BJT circuit and the current gain of the second p-type BJT in the second BJT circuit may not affect the first current (e.g. Ir1) and the second current (e.g. Ir2) respectively. Therefore, the linearity of the first current (e.g, Ir1) and the second current (e.g. Ir2) in response to the temperature may be improved.

Briefly, according to the embodiments, a control circuit is arranged to control the emitter currents of the first p-type BJT in the first circuit and the second p-type BJT in the second circuit according to the base signals of the first p-type BJT and the second p-type BJT such that the current gain of the first p-type BJT and the current gain of the second p-type BJT have less effect to the first current of the first circuit and the second current of the second circuit. By doing this, the linearity of the PTAT current in response to the temperature may be improved.

According to some embodiments, the present disclosure provides a signal generating device. The signal generating device comprises a first circuit, a second circuit, and a first control circuit. The first circuit is coupled between a first reference voltage and a second reference voltage, and arranged to generate a first current to a first BJT therein. The first control circuit is coupled to an emitter of the first BJT, for generating a first adjusting current to the first circuit for adjusting the first current such that the first circuit outputs a part of a temperature-dependent signal on an output terminal. The first control circuit comprises a first active device, a second active device and a first amplifier. The first active device includes a first connecting terminal coupled to the emitter of the first BJT, a second connecting terminal coupled to a base of the first BJT, for generating the first adjusting current. The second active device includes a first connecting terminal coupled to the base of the first BJT, a second connecting terminal coupled to a second reference voltage, for generating a third current. The first amplifier includes an input terminal coupled to the base of the first BJT, an output terminal coupled to the control terminal of the first active device. The second control circuit is coupled to the first circuit for controlling the temperature-dependent signal according to the first current.

According to some embodiments, the present disclosure provides a bandgap reference device. The bandgap reference device includes a first circuit, a second circuit, a third circuit, and a control circuit. The first circuit is coupled between a first reference voltage, a second reference voltage and an output terminal, and arranged to generate a first current to a first BJT therein. The second circuit is coupled to the output terminal, for generating a second current. The third circuit is coupled to the output terminal, for generating a bandgap reference voltage, and the third circuit comprises a resistor coupled between the first reference voltage and the second reference voltage. The control circuit is coupled to an emitter of the first BJT and the second circuit, for generating a first adjusting current to adjust the first current such that the first circuit outputs a part of a temperature-dependent signal on the output terminal. The first circuit includes a first FET, a second FET, and the first BJT. The first FET includes having a first connecting terminal coupled to the first reference voltage, a control terminal coupled to the output terminal. The second FET includes a first connecting terminal coupled to a second connecting terminal of the first FET, a control terminal coupled to the first connecting terminal of the second FET. The first BJT includes the emitter coupled to a second connecting terminal of the second FET, a collector coupled to a second reference voltage, and a base coupled to a first base signal. The control circuit includes a first active device, a second active device and an amplifier. The first active device includes a first connecting terminal coupled to the emitter of the first BJT, a second connecting terminal coupled to the base of the first BJT, for generating the first adjusting current. The second active device includes a first connecting terminal coupled to the base of the first BJT, a second connecting terminal coupled to the second reference voltage, and a control terminal coupled to the second circuit. The amplifier includes an input terminal coupled to the base of the first BJT and an output terminal coupled to the control terminal of the first active device.

According to some embodiments, the present disclosure provides a method of generating a temperature-dependent signal. The method comprises: arranging a first circuit to generate a first current to a first bipolar junction transistor (BJT) formed therein; generating a first adjusting current to adjust the first current; outputting a temperature-dependent signal on an output terminal; and arranging a second control circuit coupled to the first circuit to control the temperature-dependent signal according to the first current; wherein generating the first adjusting current to adjust the first current includes: arranging a first field-effect transistor (FET) to generate the first adjusting current to a first emitter of the first BJT; and arranging an amplifier to control the first FET according to a first base signal on a first base of the first BJT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal generating device, comprising:
    a first circuit, coupled between a first reference voltage and a second reference voltage, and arranged to generate a first current to a first bipolar junction transistor (BJT) therein;
    a first control circuit, coupled to an emitter of the first BJT, for generating a first adjusting current to the first circuit for adjusting the first current such that the first circuit outputs a part of a temperature-dependent signal on an output terminal, and the first control circuit comprises:
        a first active device, having a first connecting terminal coupled to the emitter of the first BJT, a second connecting terminal coupled to a base of the first BJT, for generating the first adjusting current;
        a second active device, having a first connecting terminal coupled to the base of the first BJT, a second connecting terminal coupled to the second reference voltage, for generating a third current;
        a first amplifier, having an input terminal coupled to the base of the first BJT, an output terminal coupled to the control terminal of the first active device; and
    a second control circuit, coupled to the first circuit, for controlling the temperature-dependent signal according to the first current.

2. The signal generating device of claim 1, further comprising:
    a second circuit, coupled between the first reference voltage and the second reference voltage, and coupled to the first circuit via the output terminal, for generating a second current to a second BJT therein.

3. The signal generating device of claim 2, wherein the first control circuit is further coupled to the second circuit for generating a second adjusting current to the second circuit for adjusting the second current such that the second circuit outputs another part of the temperature-dependent signal on the output terminal.

4. The signal generating device of claim 3, wherein the first control circuit further comprises:
    a third active device, having a first connecting terminal coupled to a emitter of the second BJT, a second connecting terminal coupled to a base of the second BJT, and a control terminal coupled to a control terminal of the first active device, for generating the second adjusting current;
    a fourth active device, having a first connecting terminal coupled to the base of the second BJT, a second connecting terminal coupled to the second reference voltage, and a control terminal coupled to a control terminal of the second active device, for generating a fourth current.

5. The signal generating device of claim 4, wherein the first amplifier is a first differential amplifier, having another input terminal coupled to the base of the second BJT.

6. The signal generating device of claim 5, wherein the first circuit comprises:
    a first field-effect transistor (FET), having a first connecting terminal coupled to a first reference voltage, a control terminal coupled to the output terminal; and
    the first BJT, having an emitter coupled to a second connecting terminal of the first FET, a collector coupled to a second reference voltage, and a base coupled to a first base signal;
    the second circuit comprises:
    a second FET, having a first connecting terminal coupled to the first reference voltage, a control terminal coupled to the output terminal;
    a first resistor, having a first terminal coupled to a second connecting terminal of the second FET; and
    the second BJT, having an emitter coupled to a second terminal of the resistor, a collector coupled to the second reference voltage, and a base coupled to a second base signal.

7. The signal generating device of claim 6, wherein the first FET and the second FET are p-type FET, the first BJT and the second BJT are p-type BJT, and the first active device, the second active device, the third active device, and the fourth active device are n-type FET.

8. The signal generating device of claim 6, wherein the first control circuit further comprises:
    a first chopper, coupled to the output terminal of the first differential amplifier;
    a second chopper, having a first side coupled to the inverting input terminal and the non-inverting input terminal of the first differential amplifier, a second side coupled to the base of the first BJT and the base of the second BJT; and a first matching device, having a first side coupled to the base of the first BJT and the base of the second BJT, and a second side coupled to the first connecting terminal of the third active device and the first connecting terminal of the fourth active device.

9. The signal generating device of claim 6, further comprising:
a third circuit, coupled to the output terminal and the first control circuit, for generating a fifth current according to the temperature-dependent signal;
wherein the second active device generates the third current and the fourth active device generates the fourth current according to the fifth current.

10. The signal generating device of claim 9, wherein the third circuit comprises:
a third FET, having a first connecting terminal coupled to the first reference voltage, a control terminal coupled to the output terminal; and
a fourth FET, having a first connecting terminal coupled to a second connecting terminal of the third FET, a second connecting terminal coupled to the second reference voltage, and a control terminal coupled to the control terminal of the third active device.

11. The signal generating device of claim 10, wherein the third FET is p-type FET, and the fourth FET is n-type FET.

12. The signal generating device of claim 10, further comprising:
a fourth circuit, coupled to the output terminal, for generating a temperature-dependent current according to the temperature-dependent signal.

13. The signal generating device of claim 12, wherein the fourth circuit comprises:
a fifth FET, having a first connecting terminal coupled to the first reference voltage, a second connecting terminal outputting the temperature-dependent current, and a control terminal coupled to the output terminal.

14. The signal generating device of claim 13, wherein the second control circuit comprises:
a second differential amplifier, having an inverting input terminal coupled to the emitter of the first BJT, a non-inverting input terminal coupled to the first terminal of the resistor, and an output terminal coupled to the control terminal of the first FET;
a first matching device, having a first side coupled to the second connecting terminal of the first FET, the second connecting terminal of the second FET, the second connecting terminal of the third FET, and the second connecting terminal of the fifth FET, and having a second side coupled to the emitter of the first BJT, the first terminal of the resistor, the first connecting terminal of the fourth FET, and for outputting the temperature-dependent current;
a first chopper, coupled to the output terminal of the second differential amplifier; and
a second chopper, having a first side coupled to the inverting input terminal and the non-inverting input terminal of the second differential amplifier, a second side coupled to the emitter of the first BJT and the first terminal of the resistor.

15. The signal generating device of claim 9, further comprising:
a fourth circuit, coupled to the output terminal, for generating an output voltage according to the temperature-dependent signal.

16. The signal generating device of claim 15, wherein the fourth circuit comprises:
a third FET, having a first connecting terminal coupled to the first reference voltage, a control terminal coupled to the output terminal;
a second resistor, having a first terminal coupled to a second connecting terminal of the third FET, for outputting the output voltage; and
a third BJT, having an emitter coupled to a second terminal of the second resistor, a collector coupled to the second reference voltage, and a base coupled to the second reference voltage.

17. A bandgap reference device, comprising:
a first circuit, coupled between a first reference voltage, a second reference voltage and an output terminal, and arranged to generate a first current to a first bipolar junction transistor (BJT) therein;
a second circuit, coupled to the output terminal, for generating a second current;
a third circuit, coupled to the output terminal, for generating a bandgap reference voltage, and the third circuit comprises a resistor coupled between the first reference voltage and the second reference voltage; and
a control circuit, coupled to an emitter of the first BJT and the second circuit, for generating a first adjusting current to adjust the first current such that the first circuit outputs a part of a temperature-dependent signal on the output terminal;
wherein the first circuit comprises:
a first field-effect transistor (FET), having a first connecting terminal coupled to the first reference voltage, a control terminal coupled to the output terminal;
a second FET, having a first connecting terminal coupled to a second connecting terminal of the first FET, a control terminal coupled to the first connecting terminal of the second FET; and
the first BJT, having the emitter coupled to a second connecting terminal of the second FET, a collector coupled to the second reference voltage, and a base coupled to a first base signal;
wherein the control circuit comprises:
a first active device, having a first connecting terminal coupled to the emitter of the first BJT, a second connecting terminal coupled to the base of the first BJT, for generating the first adjusting current;
a second active device, having a first connecting terminal coupled to the base of the first BJT, a second connecting terminal coupled to the second reference voltage, and a control terminal coupled to the second circuit;
an amplifier, having an input terminal coupled to the base of the first BJT and an output terminal coupled to the control terminal of the first active device.

18. The bandgap reference device of claim 17, further comprising:
a fourth circuit, coupled between the first reference voltage and the second reference voltage, and coupled to the first circuit via the output terminal, for generating a third current to a second BJT therein;
wherein the control circuit is further coupled to the further circuit for generating a second adjusting current to adjusting the third current such that the fourth circuit outputs another part of the temperature-dependent signal on the output terminal, and the control circuit comprises:

a third active device, having a first connecting terminal coupled to an emitter of the second BJT, a second connecting terminal coupled to the base of the second BJT, and a control terminal coupled to a control terminal of the first active device, for generating the second adjusting current; and a fourth active device, having a first connecting terminal coupled to a base of the second BJT, a second connecting terminal coupled to the second reference voltage, and a control terminal coupled to the control terminal of the second active device.

19. The bandgap reference device of claim 18, wherein the amplifier is a differential amplifier, having another input terminal coupled to the base of the second BJT.

20. A method of generating a temperature-dependent signal, comprising:

arranging a first circuit to generate a first current to a first bipolar junction transistor (BJT) formed therein;

generating a first adjusting current to adjust the first current;

outputting a temperature-dependent signal on an output terminal; and arranging a second control circuit coupled to the first circuit to control the temperature-dependent signal according to the first current;

wherein generating the first adjusting current to adjust the first current-comprises:

arranging a first field-effect transistor (FET) to generate the first adjusting current to a first emitter of the first BJT; and arranging an amplifier to control the first FET according to a first base signal on a first base of the first BJT;

arranging a second circuit to generate a second current to a second BJT formed therein, wherein the second circuit is coupled to the first circuit via the output terminal; and generating a second adjusting current to adjust the second current;

wherein generating the second adjusting current to adjusting the second current comprises:

arranging a second FET to generate the second adjusting current to a second emitter of the second BJT; and arranging the amplifier to control the second FET according to a second base signal on a second base of the second BJT.

* * * * *